(12) United States Patent
Hua et al.

(10) Patent No.: US 8,497,206 B2
(45) Date of Patent: Jul. 30, 2013

(54) METHOD OF PROCESSING BACKSIDE COPPER LAYER FOR SEMICONDUCTOR CHIPS

(75) Inventors: Chang-Hwang Hua, Tao Yuan Shien (TW); Wen Chu, Tao Yuan Shien (TW)

(73) Assignee: WIN Semiconductor Corp., Kuei Shan Hsiang, Tao Yuan Shien (TW)

( * ) Notice: Subject to any disclaimer, the term of this patent is extended or adjusted under 35 U.S.C. 154(b) by 516 days.

(21) Appl. No.: 12/757,458

(22) Filed: Apr. 9, 2010

(65) Prior Publication Data
US 2011/0201192 A1 Aug. 18, 2011

(30) Foreign Application Priority Data
Feb. 12, 2010 (TW) ................. 99104593 A

(51) Int. Cl.
*H01L 21/441* (2006.01)
*H01L 29/41* (2006.01)
(52) U.S. Cl.
USPC ........... 438/667; 438/620; 438/928; 257/502; 257/E21.548; 257/E21.553; 257/E21.585
(58) Field of Classification Search
USPC ......................................................... 438/928
See application file for complete search history.

(56) References Cited

U.S. PATENT DOCUMENTS

2007/0045780 A1* 3/2007 Akram et al. ............... 257/621
2010/0090304 A1* 4/2010 Liu et al. .................... 257/432

* cited by examiner

*Primary Examiner* — Zandra Smith
*Assistant Examiner* — Pamela E Perkins
(74) *Attorney, Agent, or Firm* — Muncy, Geissler, Olds & Lowe, PLLC

(57) ABSTRACT

A method of processing copper backside metal layer for semiconductor chips is disclosed. The backside of a semiconductor wafer, with electronic devices already fabricated on the front side, is first coated with a thin metal seed layer by either electroless plating or sputtering. Then, the copper backside metal layer is coated on the metal seed layer. The metal seed layer not only increases the adhesion between the front side metal layer and the copper backside metal layer through backside via holes, but also prevents metal peeling from semiconductor's substrate after subsequent fabrication processes, which is helpful for increasing the reliability of device performances. Suitable materials for the metal seed layer includes Pd, Au, Ni, Ag, Co, Cr, Pt, or their alloys, such as NiP, NiB, AuSn, Pt—Rh and the likes. The use of Pd as seed layer is particularly useful for the copper backside metal layer, because the Pd layer also acts as a diffusion barrier to prevent Cu atoms entering the semiconductor wafer.

22 Claims, 13 Drawing Sheets

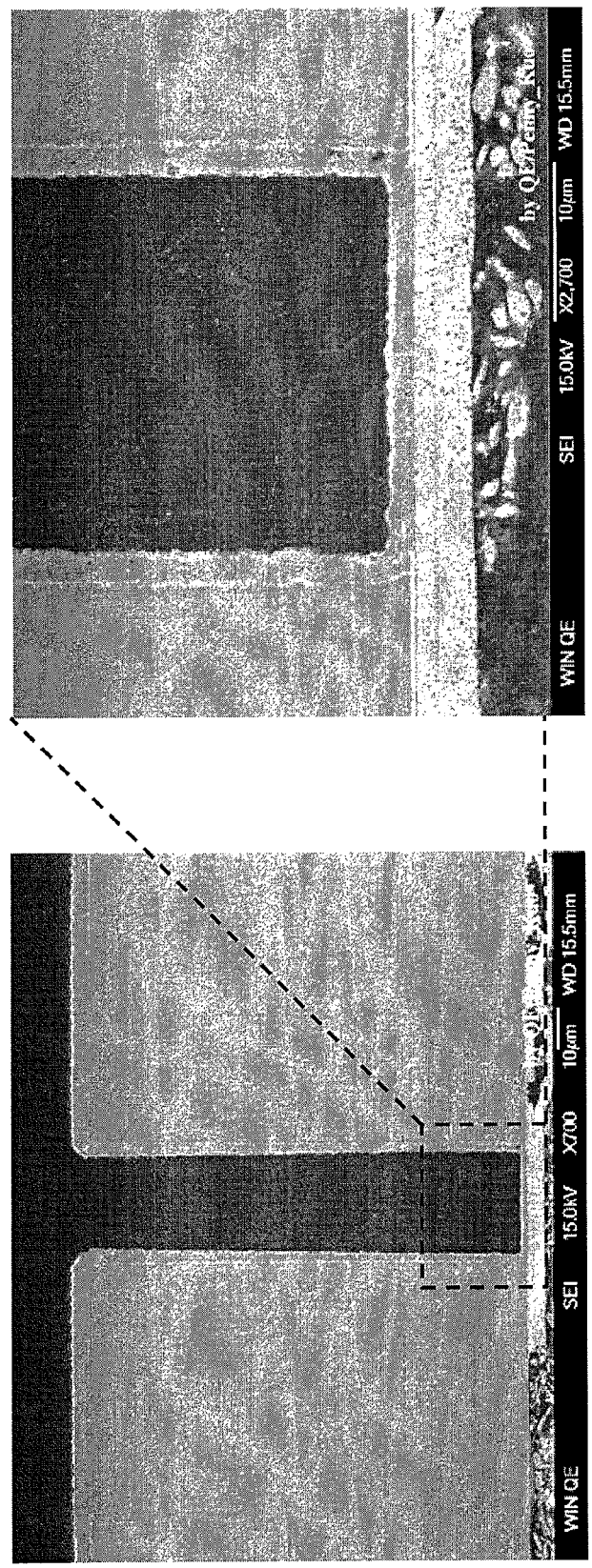

METHOD OF PROCESSING BACKSIDE COPPER LAYER FOR SEMICONDUCTOR CHIPS

BACKGROUND OF THE INVENTION

1. Field of the Invention

The present invention discloses a method of backside metal process for semiconductor chips, particularly of using a copper layer as a backside metal layer and coating an oxidation preventing layer to protect the copper layer against oxidation.

2. Background of the Invention

Heterojunction Bipolar Transistors (HBTs) as well as High-Electron Mobility Transistors and (HEMTs) are important semiconductor electronic devices for a variety of applications, such as microwave, millimeter wave, and optoelectronic applications. For advanced multifunction devices, which include more than one device type on a common substrate, it is important to consider not only the die size and cost reduction, but also the performance of the integrated circuits with additional functionality. To achieve this goal, much effort has been made on the development of reliable fabrication processes of monolithic integrated devices for volume productions.

Backside metal process is one of the key process steps for the fabrication of integrated semiconductor devices. Regardless of device types and functionalities, it is necessary to provide grounding for those transistors fabricated on the front surface of a semiconductor wafer. Therefore, ground pads were usually disposed either in the vicinity of, or at a distance from, those front-side devices, depending on the surface device layout. In general, for a space saving purpose, a common ground pad is usually shared by many transistors. FIG. 1 is a cross-sectional view of a substrate formed by a semiconductor wafer 100 with ground pads formed thereon. The ground pad consists of a surface metal layer 101, a backside via hole 102 and a backside metal layer 103, which contacts electrically to the surface metal layer 101 through the backside via hole 102. Conventionally, electronic devices, such as HBTs and HEMTs, are first fabricated on the front surface. A surface metal layer is then deposited to define ground pad areas. The substrate is usually mechanically thinned to a certain thickness, in order to facilitate subsequent fabrication processes for backside via holes 102. The positions, sizes and shapes of backside via holes 102 are then defined on the wafer backside using the conventional lithography technique, and followed by either dry or wet chemical etchings to create via holes through the wafer to the surface metal layer 101. Finally, a backside metal layer 103 is deposited on the wafer backside, by which a good electrical contact to the surface metal layer 101 via the backside via holes 102 can be achieved. It is worth to mentioned that since the surface metal layer 101 of the ground pad is contacted not only electrically but also thermally to the whole backside metal layer 103 through the via hole 102, the ground pad can also acts as a heat sink for the front side devices.

Conventionally, the backside metal processes for GaAs based integrated devices usually utilize a sputter to coat a metal seed layer on the rear surface and the backside via holes. However, by using the conventional method, it is difficult to form a thin metal seed layer with good uniformity and free of defect, and thereby hard to provide good adhesion for backside metals (such as Au, Al or Cu, etc.) on the rear surface, and particularly on the inner sidewalls of via holes. This situation will become even worse for via holes with very large aspect ratio. As a consequence, the backside metal layer becomes easily to be peeled off from the surface metal layer after subsequent fabrication processes, leading to poor device grounding and hence degradations in device performance, reliability and overall yield.

The material of the backside metal itself is also an important consideration. For GaAs-based integrated devices, the most commonly used backside metal is gold. Recently, semiconductor manufacturers have begun using copper as backside metal, because of its lower resistivity and manufacture costs. However, a drawback of using copper as a backside metal is that Cu atoms can easily diffuse into the GaAs substrate, which can even reach the active area of front-side devices, leading to device damages.

Therefore, it is necessary to develop a method of backside metal process for semiconductor electronic devices, which not only improves the adhesion between the front side metal layer and the backside metal layer through backside via holes, but also prevents metallic atoms of the backside metal diffusing into the active area of front surface devices. In addition, another important issue of using copper instead of gold as backside metal layer is that copper is easily oxidized, so that coating an oxidation preventing layer on the copper layer is necessary. However, after wafer sawing into dies, the copper layer can still be oxidized from die edges. Therefore, developing a suitable process to prevent the copper layer from oxidization after wafer sawing is also important.

SUMMARY OF THE INVENTION

It is an object of the present invention to provide a fabrication method of processing backside copper layer for integrated semiconductor devices, by which a good electrical contact between the backside copper layer and the front side metal layer can be achieved, and the metal peeling during subsequent fabrication processes can be prevented.

It is also an object of the present invention to provide a fabrication method to prevent the diffusion of Cu atoms from the wafer backside into the active area of front side devices.

It is still an object of the present invention to provide a fabrication method to prevent the backside copper layer from oxidation even after wafer sawing.

In order to achieve the abovementioned objects, the present invention provide a method of processing backside copper layer for semiconductor wafers with devices fabricated thereon and after wafer thinning processes, comprise steps of:

Fabricating backside via holes on the wafer backside using conventional photolithography techniques and using either dry or wet chemical etchings;

coating a thin metal layer or a thin metallic alloy layer as a backside metal seed layer on the wafer's rear surface and on the inner sidewalls of the backside via holes;

depositing a copper layer on the metal seed layer as a backside metal layer to make good electrical contact to the surface metal layer via the backside via holes;

fabricating backside trenches on the wafer backside using conventional photolithography techniques and chemical etching to remove the copper layer on the backside trenches; and coating an oxidation preventing layer on the copper layer to protect the copper layer against oxidation.

The advantages of the method of processing copper backside metal layer for semiconductor chips are manifold, including 1. Cost reduction;
2. Volume production;
3. High uniformity in the thickness of backside metal layer;
4. Good adhesion to substrate;

5. Preventing diffusions of Cu atoms into the semiconductor wafer

6. Protecting the copper layer against oxidation after wafer sawing

7. Better yield for front side devices.

Suitable materials for the metal seed layer includes Pd, Au, Ni, Ag, Co, Cr, Pt, or their alloys, such as NiP, NiB, AuSn, Pt—Rh and the likes.

The following detailed description, given by ways of examples or embodiments, will best be understood in conjunction with the accompanying drawings.

BRIEF DESCRIPTION OF DRAWINGS

FIGS. 3(a) to 3(d) are cross sectional SEM images of a real semiconductor wafer near the backside via holes.

DETAILED DESCRIPTION OF THE INVENTION

Figure 1:
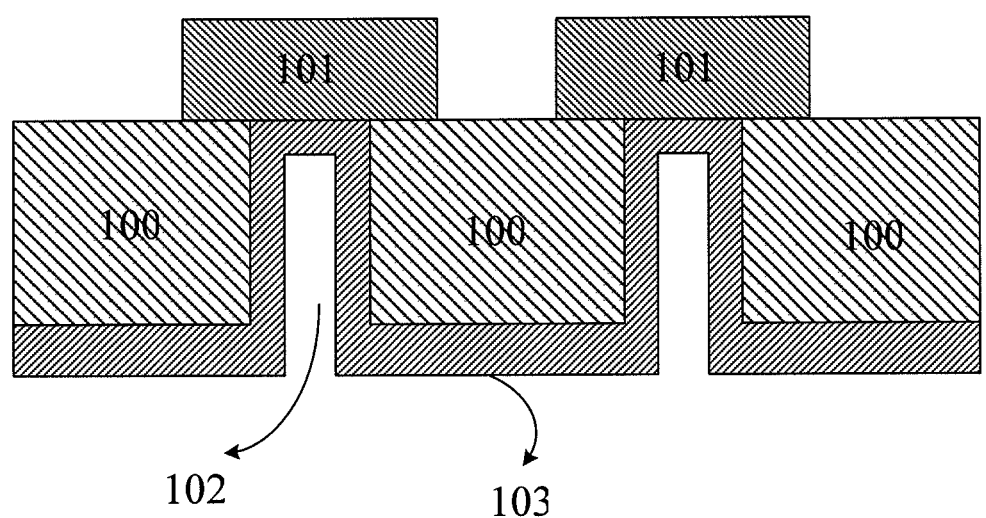
FIG. 1 is a schematic of the cross-sectional view of a substrate formed by a semiconductor wafer with ground pads formed thereon. It clearly illustrates how the front side metal layer of the ground pad can make a good electrical contact to the backside metal layer through backside via holes.
Figure 2A:
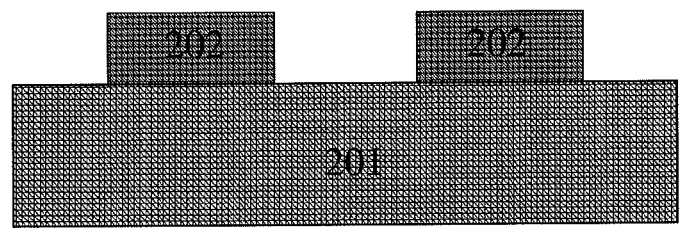
FIGS. 2(a) to 2(f) are schematics illustrating the process flow of the method of processing backside copper layer for semiconductor chips of the present invention.
Figure 2B:
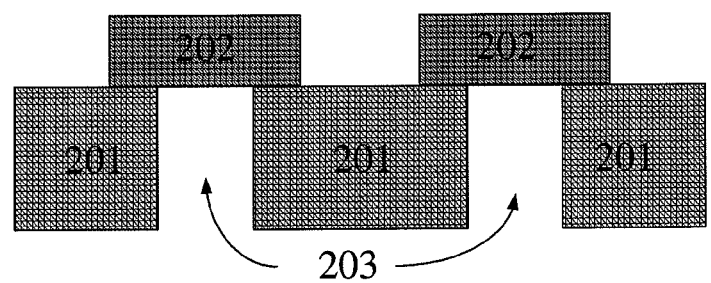
Figure 2C:
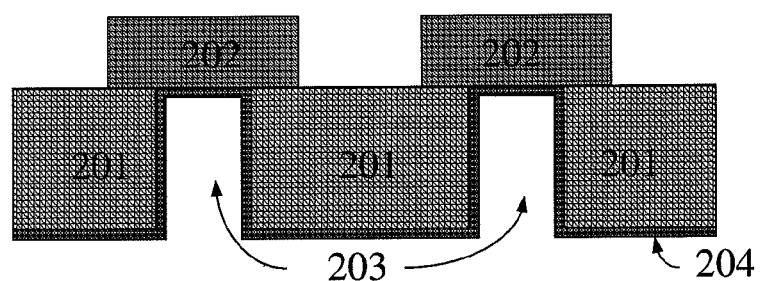

FIGS. 2(a) to 2(f) are schematics illustrating the process flow of the present invention for processing backside copper layer for semiconductor chips. The semiconductor chips herein are made of compound semiconductors. Electronic devices formed on a GaAs substrate is a preferred embodiment. As shown in FIG. 2(a), the process starts from a semiconductor wafer 201 with a surface metal layer 202 fabricated thereon. The semiconductor wafer 201 can be thinned mechanically to a certain thickness, in order to facilitate subsequent fabrication processes for backside via holes. FIG. 2(b) illustrates the first step of the present invention. In the first step, the sizes, shapes and positions of backside via holes 203 are first defined on the backside of the semiconductor wafer 201 using the conventional lithography technique. Etching processes are then performed to etch via holes through the semiconductor wafer to the surface metal layer 202. The etching process can be done either by dry etching process using the reactive ion etching (RIE) or inductively coupled plasma (ICP) etching technique, or by wet etching process using suitable chemical solutions as etchants. FIG. 2(c) is the second step of the present invention. In this step, a thin metal layer or a metallic alloy layer, which will act as a seed layer 204 for subsequent backside metal layer, is coated on the backside of the semiconductor wafer 201. Suitable materials for the metal seed layer includes Pd, Au, Ni, Ag, Co, Cr, Pt, or their alloys, such as NiP, NiB, AuSn, Pt—Rh and the likes. In this step, the metal seed layer can be coated by using the conventional sputtering technique or using the electroless plating technique. The electroless plating technique is a commonly used method for coating a thin metal film on another host material, and is particular useful on those materials with poor electrical conductivity. The electroless plating is performed by immersing the semiconductor wafer in a plating solution containing sources of metal, following by treatment of reducing agent, which will make metallic ions in the solution metalized on the wafer and forming a thin film. For electroless palladium plating as an example, the plating solution is usually an aqueous solution of palladium salt, such as palladium chloride, palladium bromide, palladium nitrate, palladium sulfate, palladium oxide or palladium hydroxide. After treatment with suitable reducing agents, such as formaldehyde, formic acid or hypophosphorous acid, metallic palladium will be adhered onto the backside of semiconductor wafer. By controlling the concentration, temperature and pH value of the plating solution as well as plating time, the thickness of palladium film can be precisely controlled. According to the experimental results of the present invention, the preferred thickness of metal seed layer is in the range of 20-500 nm.

Figure 2D:
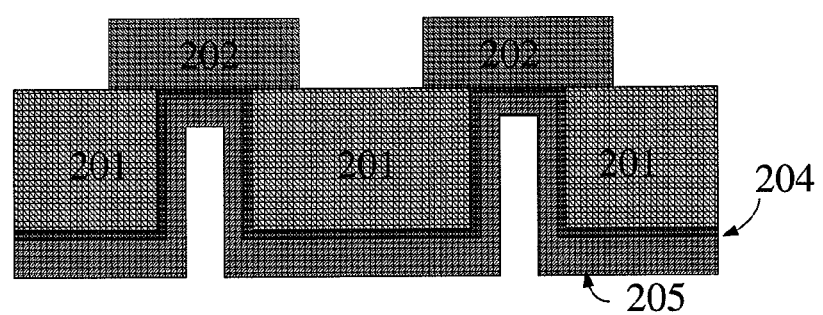
Figure 2E:
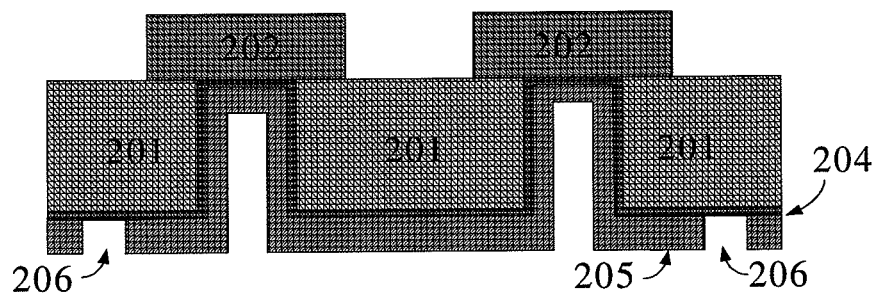
Figure 2F:
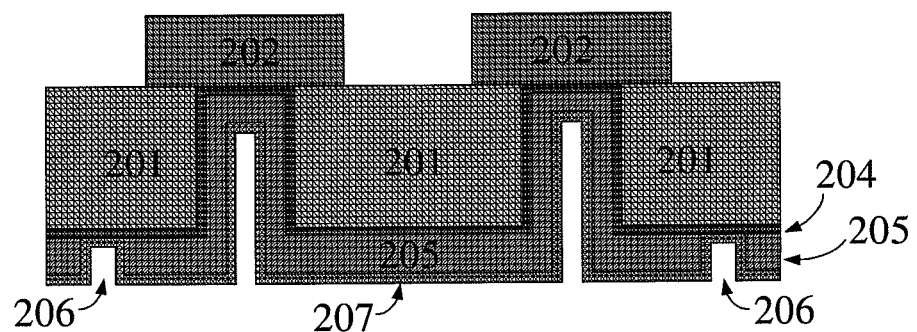
Figure 3B:
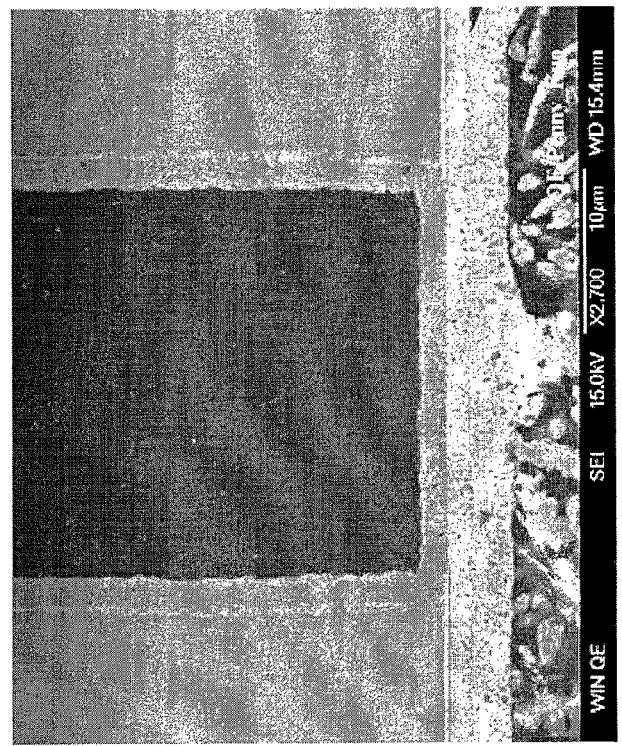
Figure 3A:
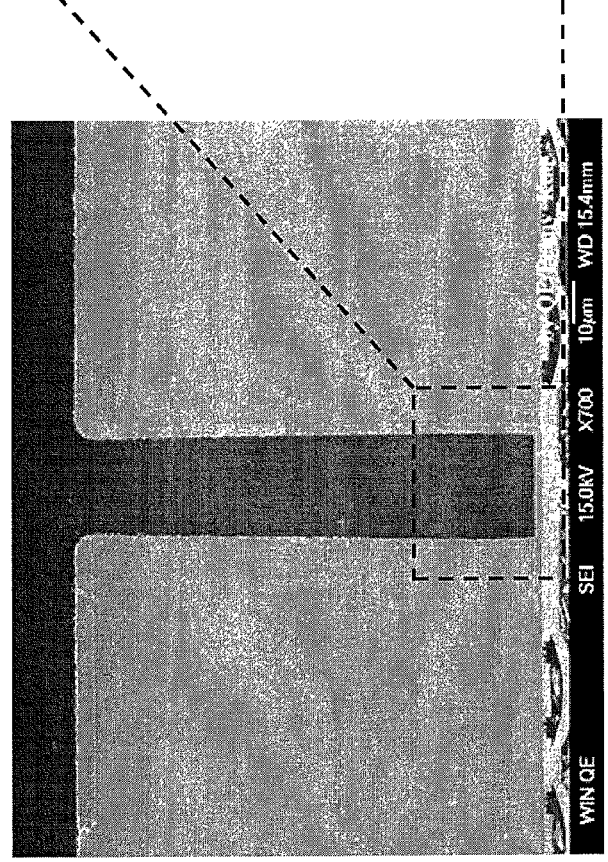

FIG. 2(d) is the third step of the present invention, in which a copper layer 205, which acts as a backside metal layer, is deposited on the metal seed layer 204. FIG. 2(e) is the fourth step of the present invention. In this step, backside trenches 206 are fabricated on the wafer backside using conventional photolithography techniques and chemical etching to remove the copper layer on the backside trenches 206. Because the suitable thickness of the backside copper layer 205 is ranging from 1 μm to a few μm, it is not quite straightforward to saw the wafer with backside copper layer into dies. Thus, the fabrication of the backside trenches 206 and removing copper layer thereon can facilitate wafer sawing. The final step of the present invention is illustrated in FIG. 2(f). After the fabrication of backside trenches 206, the wafer backside is coated with an oxidation preventing layer 207 on the copper layer to protect the copper layer against oxidation. The oxidation preventing layer can be gold, or other metals or metallic alloys, such as Pd, Ni—Au, N—Pd, Pd—Au, or Ni—Pd—Au. The advantage of fabricating the backside trenches 206 before coating the oxidation preventing layer 207 is that the backside copper layer 205 can be completely protected by the oxidation preventing layer 207 even after wafer sawing into dies. However, if the oxidation preventing layer 206 is coated on the backside copper layer 205 without backside trenches 206, the copper layer 205 can still be oxidized from die edges after wafer sawing, which will significantly degrade the device reliability.

Figure 4B:
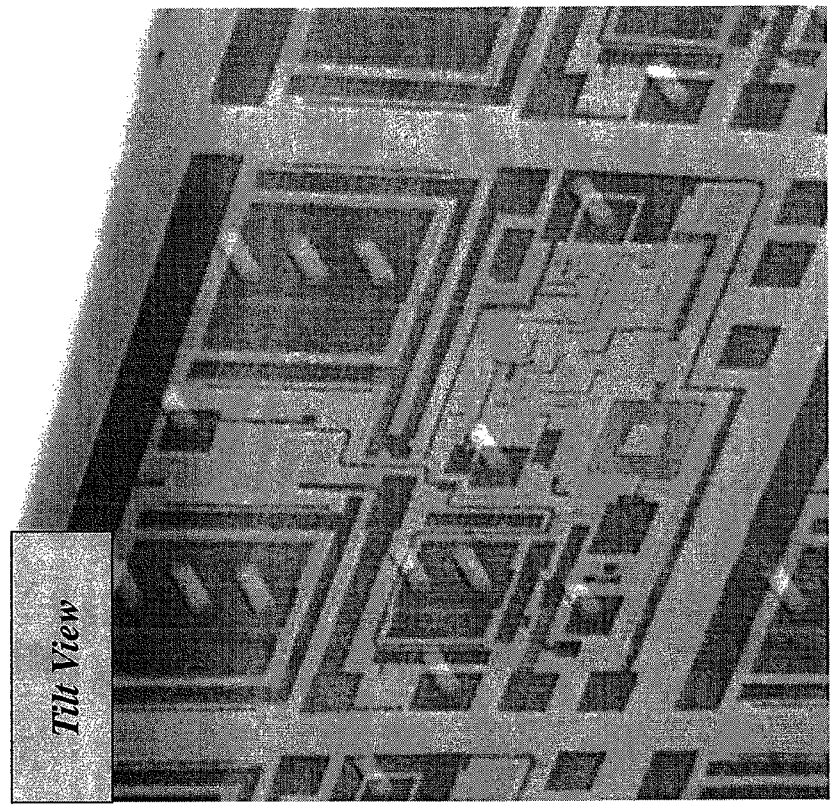
FIGS. 4(a) to 4(b) are three-dimensional x-ray images near the backside via holes of a real semiconductor wafer with devices fabricated thereon.
Figure 4A:
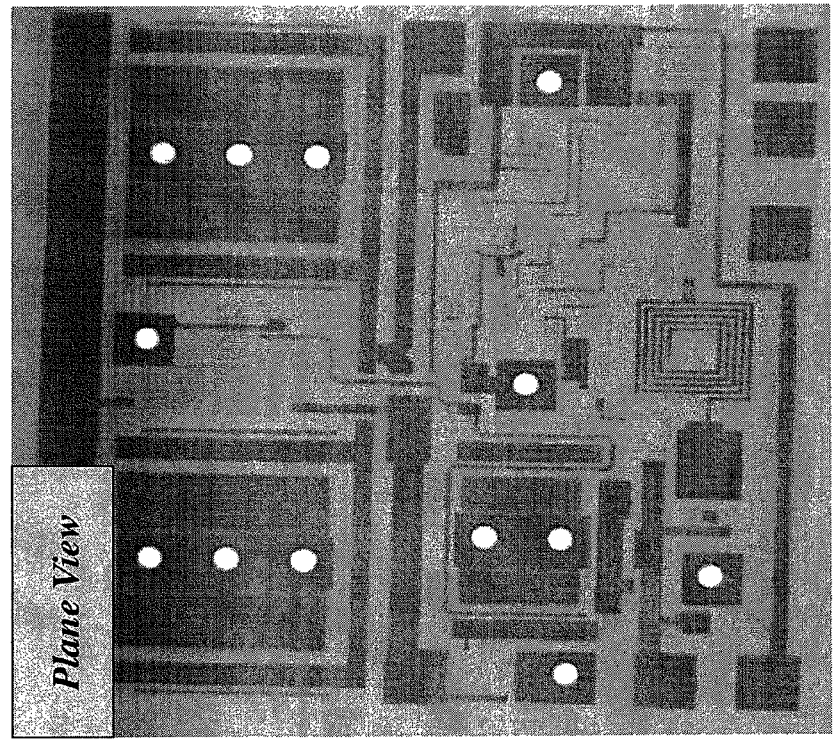
Figure 5A:
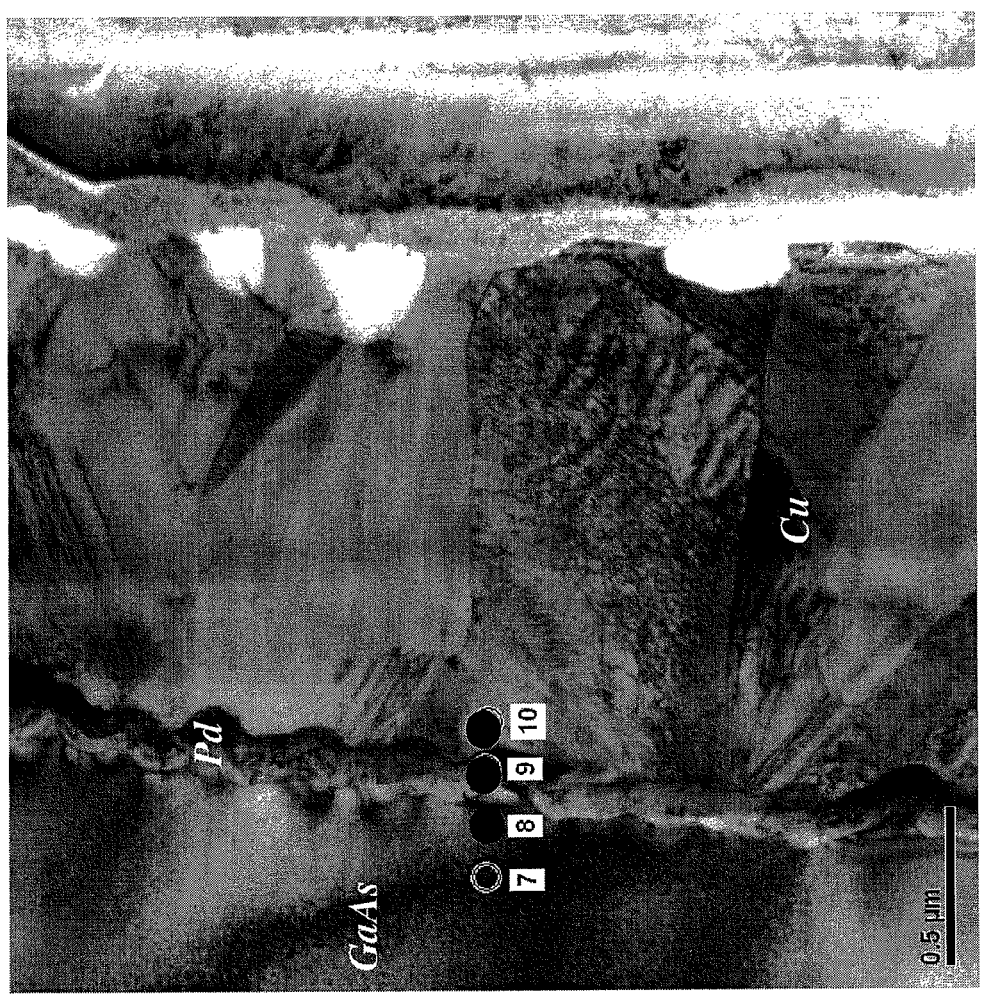
FIGS. 5(a) to 5(d) are composition analyses for different layers of a GaAs wafer coating with a Pd seed layer and a backside Cu layer using the method of the present invention. The results are analyzed by the energy dispersive spectroscopy (EDS) in a transmission electron microscope (TEM).
Figure 5B:
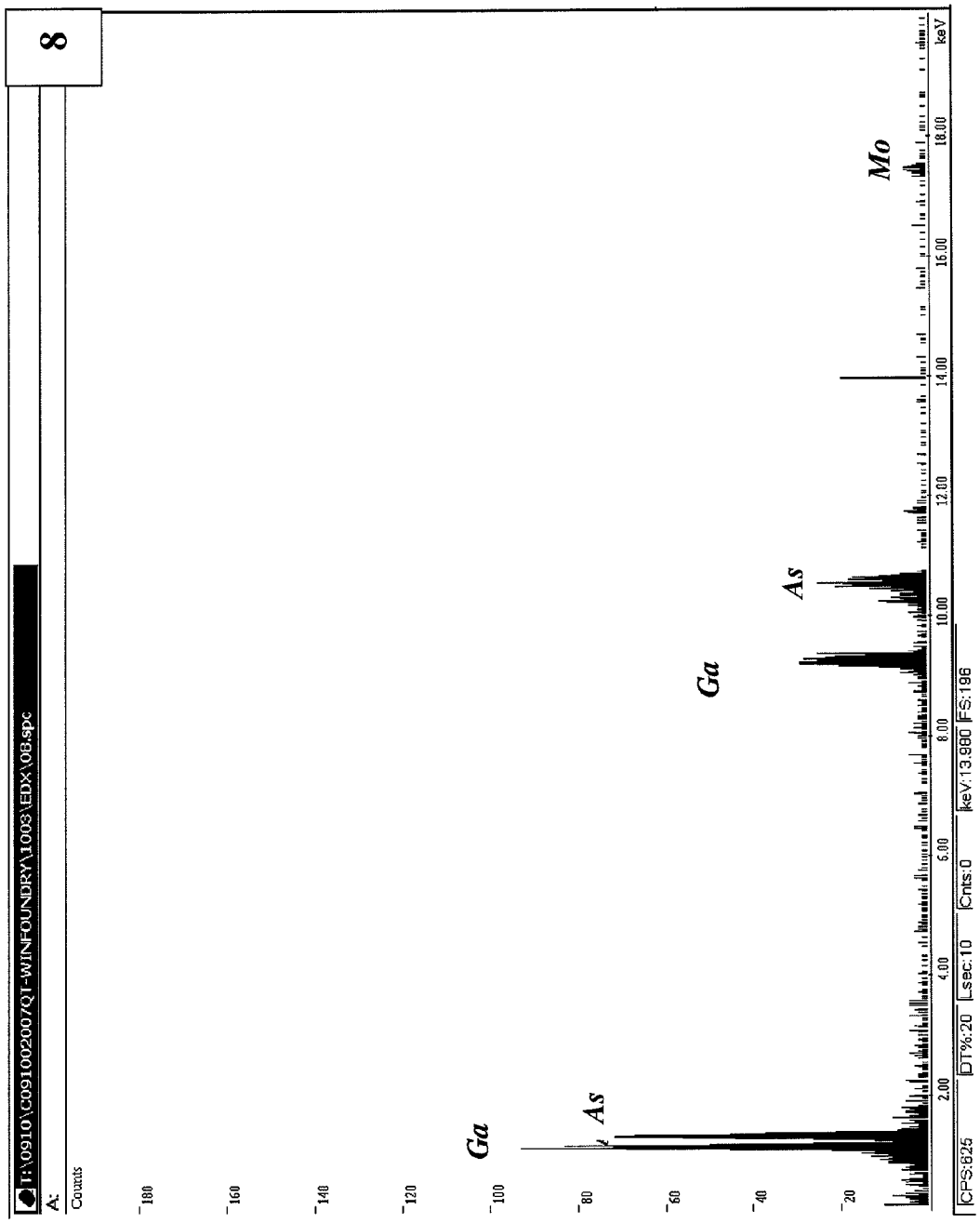
Figure 5C:
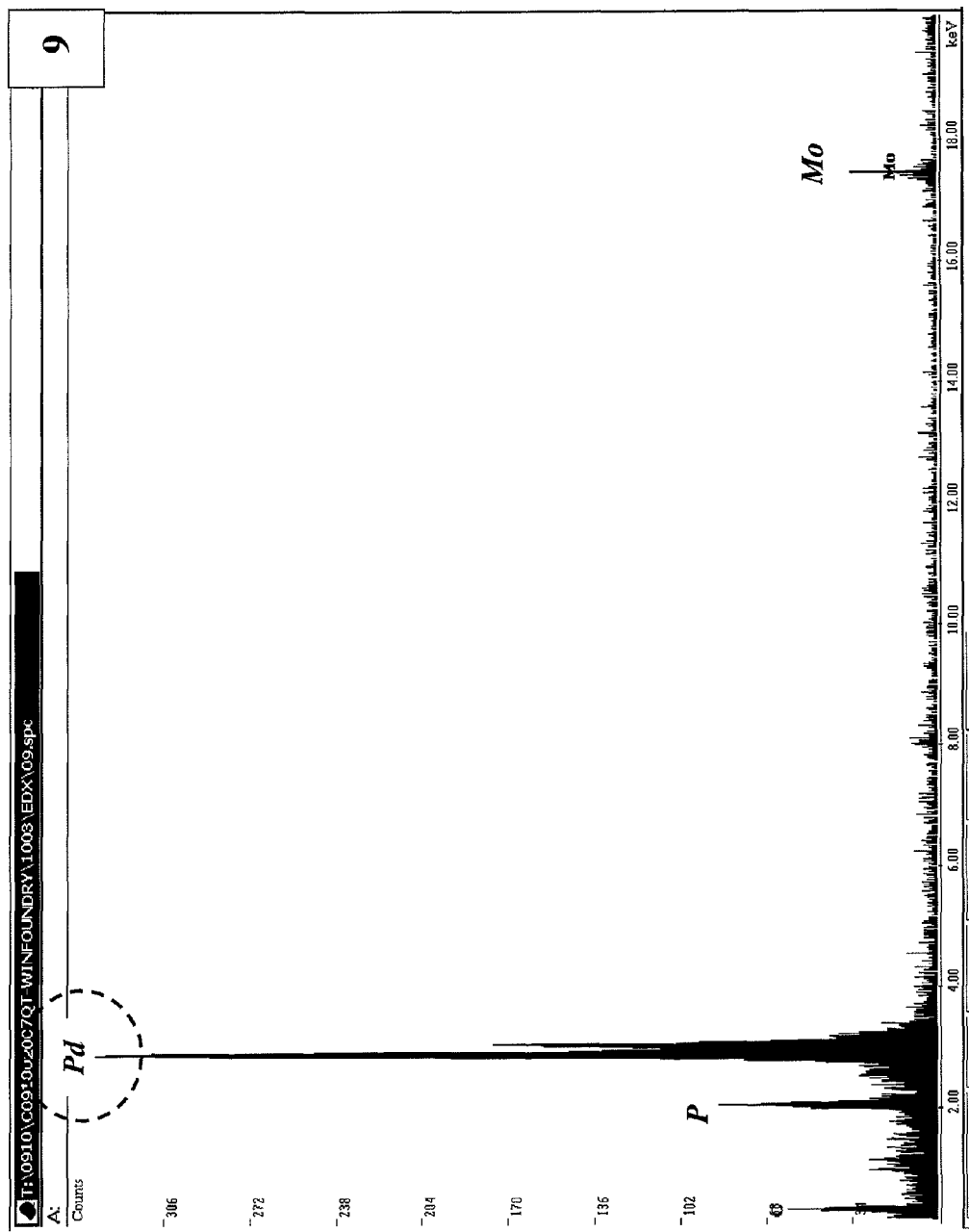
Figure 5D:
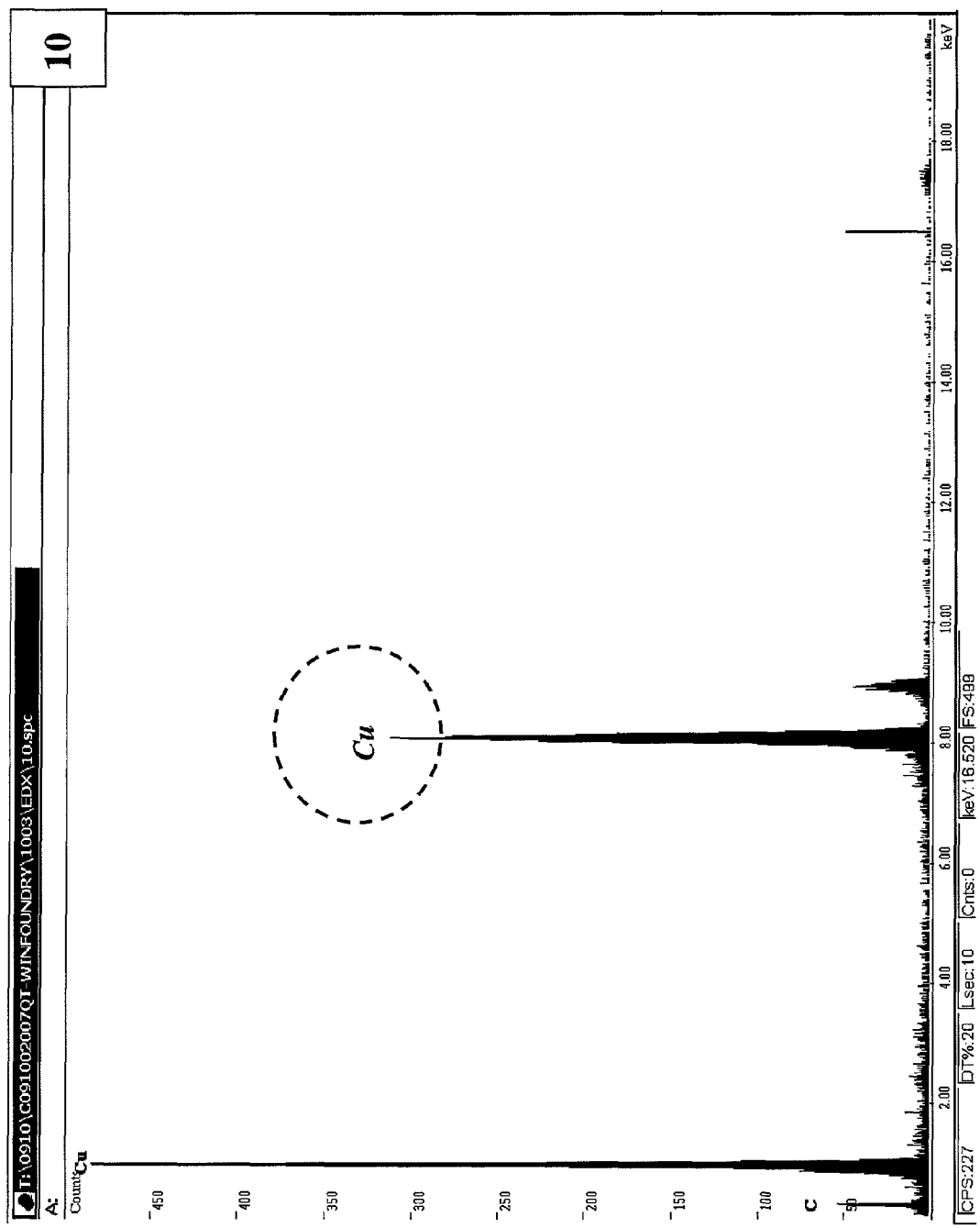

The method of processing backside copper layer of the present invention has been proven experimentally that metal peeling effect can be effectively prevented, making good electrical contact between the surface metal and the backside metal layers. FIGS. 3(a) to 3(d) and FIGS. 4(a) and 4(b) are experimental results using electroless palladium plating layer as a seed layer for the backside copper layer. In FIGS. 3(a) to 3(d), a number of cross sectional SEM images of a real semiconductor wafer near a backside via hole are displayed. It can be seen from FIGS. 3(a) to 3(d) that even the wafer has been treated by hot baking at 350° C. for 30 minutes, no apparent metal peeling can be found. FIGS. 4(a) and 4(b) are three-dimensional X-ray images near the backside via holes of a real semiconductor wafer with devices fabricated thereon. Again, no apparent metal peeling can be found in the wafer with electrolessly plated seed layer for backside Cu layer even after high temperature treatment of hot baking at 350° C. for 30 minutes.

It has also been confirmed experimentally that the Pd seed layer also acts as a diffusion barrier, which can effectively prevent the diffusion of Cu atoms from the wafer backside into the active area of front side devices. FIGS. 5(a) to 5(d) are composition analyses for different layers of a GaAs wafer coating with a Pd seed layer and a backside Cu layer using the method of the present invention. These results are analyzed by the energy dispersive spectroscopy (EDS) in a transmission electron microscope (TEM). We found that the Cu composition in the GaAs region is negligible, indicating that the Pd seed layer is a good diffusion barrier for Cu atoms.

Figure 6:
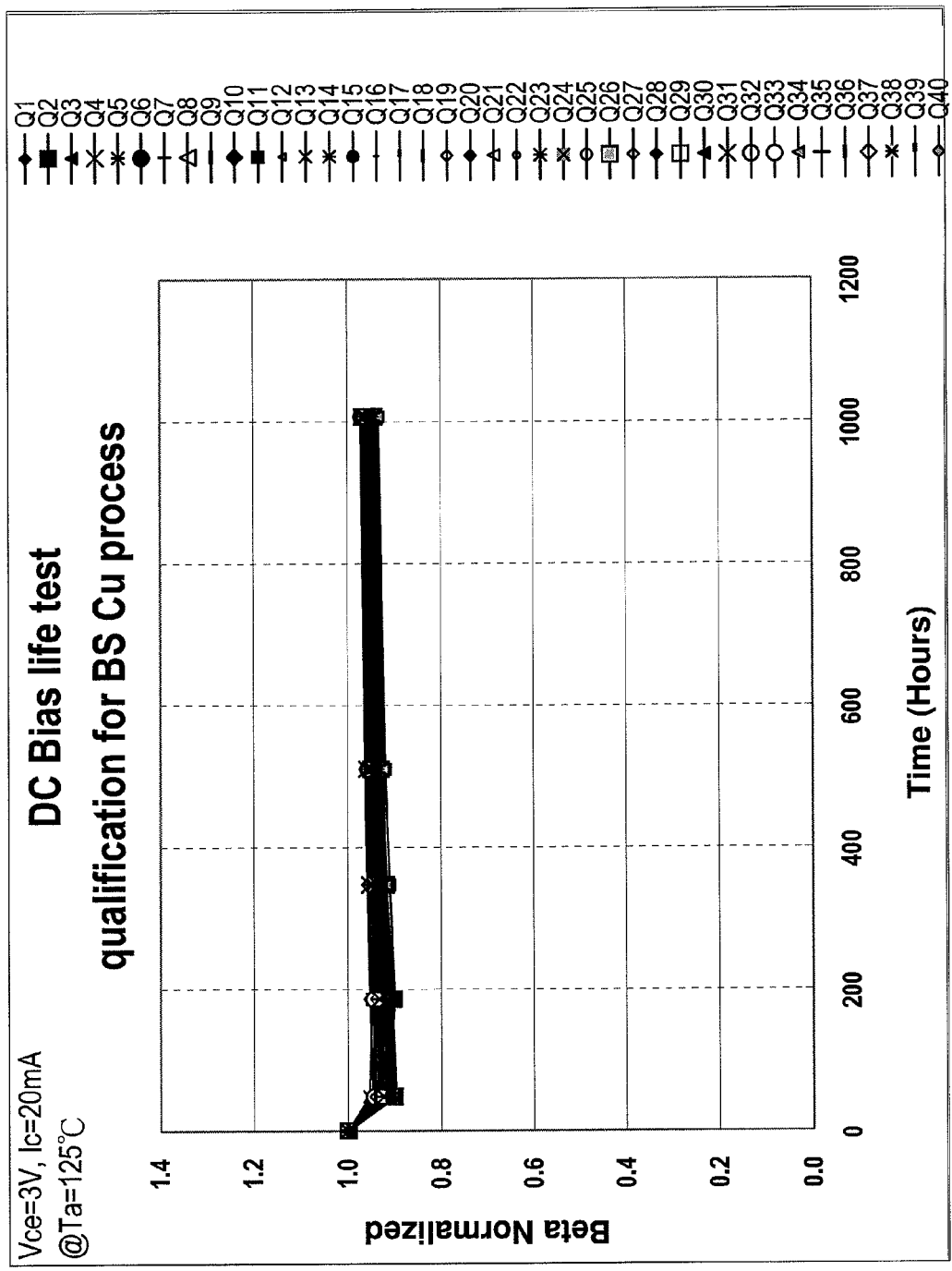
FIG. 6 is the HTOL testing result of current gain (beta) for those transistors fabricated on wafers with backside copper layer processed by the method of the present invention. The test conditions are $V_{CE}$=3 V, $I_C$=20 mA at 125° C. for 1000 hrs.

In addition, the performances of devices on wafer with copper backside metal layer fabricated by the method of the present invention have also been examined thoroughly. It was found that the use of electrolessly plated seed layer for backside metal layer can indeed retain very good device performance and reliability. FIG. 6 is the HTOL testing result of current gain (beta) for those transistors fabricated on wafers with copper backside metal layer processed by the method of the present invention. Under the testing temperature of 125° C. and an operating voltage and current of $W_{CE}=3$ V and $I_C=20$ mA for 1,000 hours, the measured beta values are nearly unchanged, indicating a good device reliability.

Figure 7A:
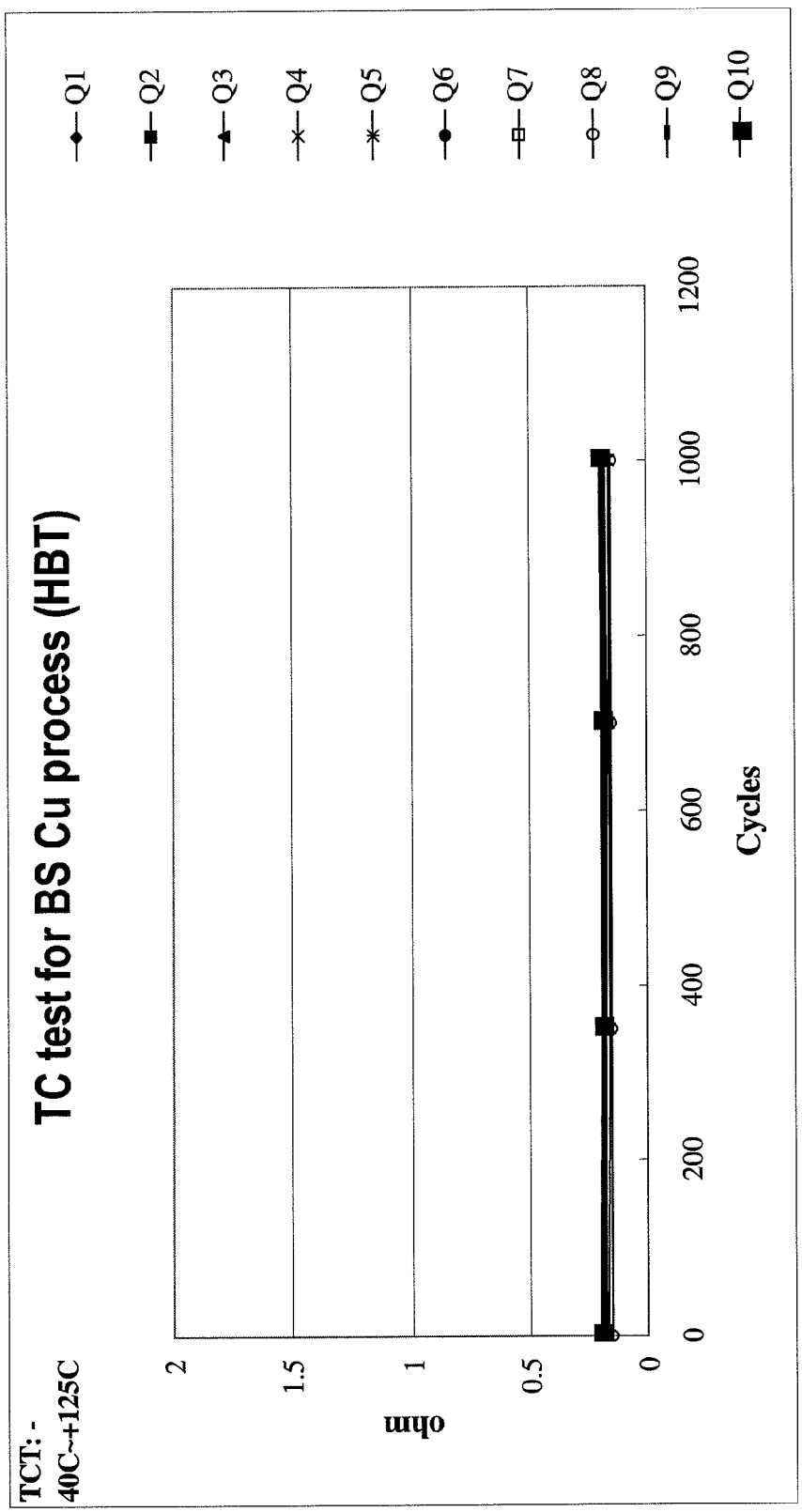
FIGS. 7(a) to 7(b) are the thermal-cycle (TC) testing result of resistance for those transistors fabricated on wafers with backside copper layer processed by the method of the present invention. (a) HBT device. (b) pHEMT device.
Figure 7B:
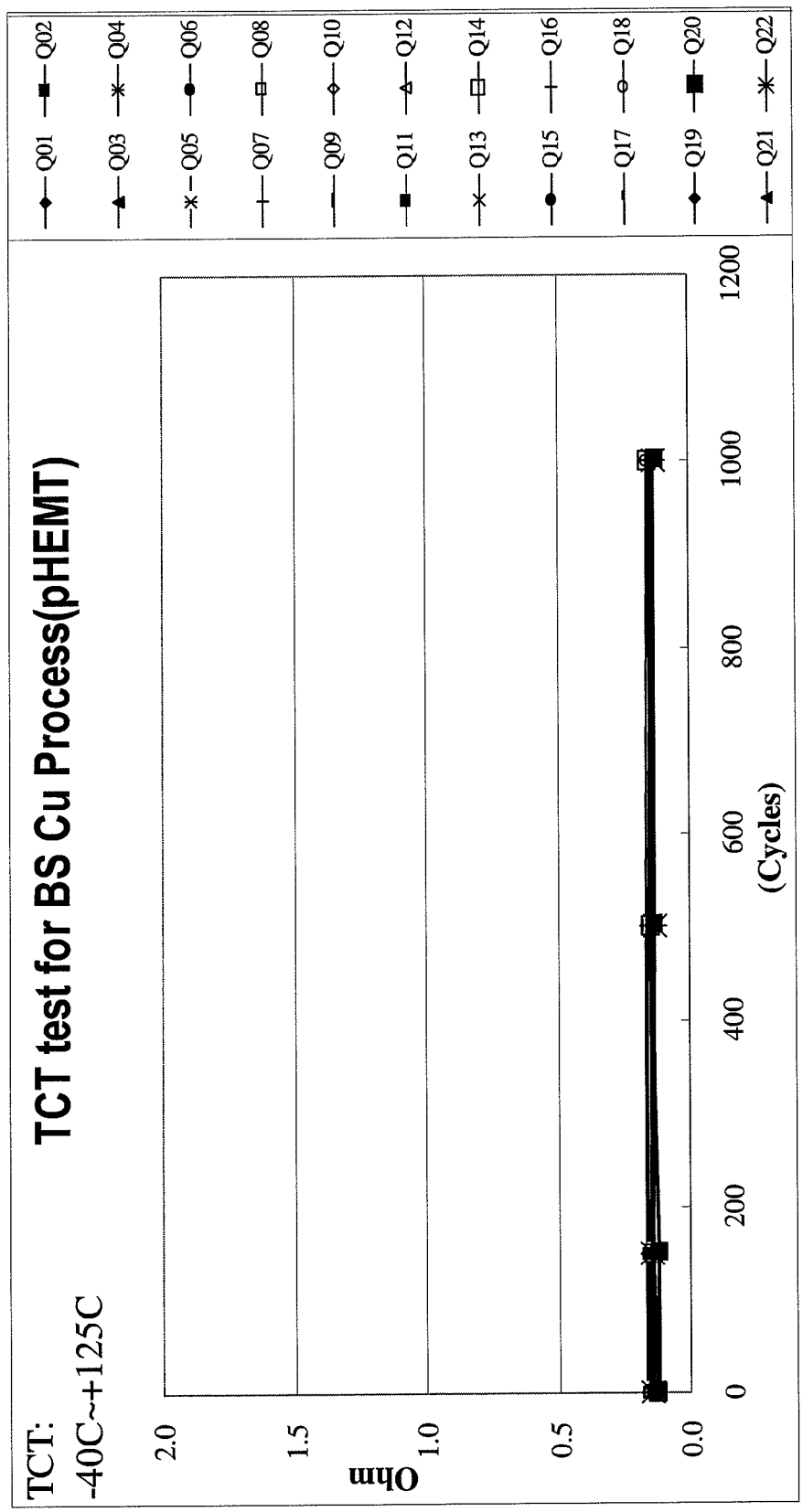

In addition, thermal-cycling (TC) tests for the resistances between the surface metal and the copper backside metal layer have also been measured. As shown in FIGS. 7(a) and 7(b), the measured values of resistances for both HBT and pHEMT devices are also nearly unchanged after 1,000 times TC from −40° C. to 125° C., indicating that the metal peeling can be prevented by using the method of the present invention to processes the copper backside metal layer.

As discussed above, the present invention disclosing the method of processing backside copper layer for semiconductor chips has the following advantages:

1. Cost reduction;
2. Volume production;
3. High uniformity in the thickness of backside metal layer;
4. Good adhesion to substrate;
5. Preventing diffusions of Cu atoms into the semiconductor wafer
6. Protecting the copper layer against oxidation after wafer cutting
7. Better yield for front side devices.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A method of processing a backside copper layer for semiconductor wafers with electronic devices already fabricated thereon comprising the steps of:

Fabricating backside via holes on the wafer backside using conventional photolithography techniques and using either dry or wet chemical etchings;

coating a thin metal layer or a thin metallic alloy layer as a seed layer on the wafer's rear surface and on the inner sidewalls of the backside via holes;

depositing a copper layer on the seed layer as a backside metal layer to make good electrical contact to the surface metal layer via the backside via holes;

fabricating backside trenches on the wafer backside using conventional photolithography techniques and chemical etching to remove the copper layer on the backside trenches; and coating an oxidation preventing layer on the copper layer to protect the copper layer against oxidation.

2. The method of processing backside copper layer described in claim 1, wherein said seed layer is coated by the electroless plating technique, which is performed by immersing the semiconductor wafer in a plating solution containing sources of metals, following by treatment of reducing agent, which makes metallic ions in the solution metalized to a thin film on the backside of the semiconductor wafer.

3. The method of backside metal processes described in claim 2, wherein the material of said seed layer is Pd, Au, Ni, Ag, Co, Cr, Cu, Pt, or their alloys, such as NiP, NiB, AuSn, Pt—Rh.

4. The method of backside metal processes described in claim 2, wherein said semiconductor wafer is a compound semiconductor wafer.

5. The method of backside metal processes described in claim 4, wherein compound semiconductor wafer is GaAs.

6. The method of backside metal processes described in claim 2, wherein said etching process is the dry etching process using the reactive ion etching (RIE) or inductively coupled plasma (ICP) etching technique, or the wet etching process using suitable chemical solutions as etchants.

7. The method of backside metal processes described in claim 2, wherein the materials of said oxidation preventing layer is Au, Pd, Ni—Au, N—Pd, Pd—Au, or Ni—Pd—Au.

8. The method of processing backside copper layer described in claim 2, wherein said seed layer coated by the electroless plating method has a preferred thickness in the range of 20-500 nm.

9. The method of backside metal processes described in claim 8, wherein said etching process is the dry etching process using the reactive ion etching (RIE) or inductively coupled plasma (ICP) etching technique, or the wet etching process using suitable chemical solutions as etchants.

10. The method of backside metal processes described in claim 8, wherein the materials of said oxidation preventing layer is Au, Pd, Ni—Au, N—Pd, Pd—Au, or Ni—Pd—Au.

11. The method of processing backside copper layer described in claim 1, wherein said seed layer is coated by the sputtering technique.

12. The method of backside metal processes described in claim 11, wherein the material of said seed layer is Pd, Au, Ni, Ag, Co, Cr, Cu, Pt, or their alloys, such as NiP, NiB, AuSn, Pt—Rh.

13. The method of backside metal processes described in claim 11, wherein said semiconductor wafer is a compound semiconductor wafer.

14. The method of backside metal processes described in claim 13, wherein compound semiconductor wafer is GaAs.

15. The method of processing backside copper layer described in claim 1, wherein said seed layer coated by the electroless plating method has a preferred thickness in the range of 20-500 nm.

16. The method of backside metal processes described in claim 15, wherein said etching process is the dry etching process using the reactive ion etching (RIE) or inductively coupled plasma (ICP) etching technique, or the wet etching process using suitable chemical solutions as etchants.

17. The method of backside metal processes described in claim 15, wherein the materials of said oxidation preventing layer is Au, Pd, Ni—Au, N—Pd, Pd—Au, or Ni—Pd—Au.

18. The method of backside metal processes described in claim 1, wherein the material of said seed layer is Pd, Au, Ni, Ag, Co, Cr, Cu, Pt, or their alloys, such as NiP, NiB, AuSn, Pt—Rh.

19. The method of backside metal processes described in claim 1, wherein said semiconductor wafer is a compound semiconductor wafer.

20. The method of backside metal processes described in claim 19, wherein compound semiconductor wafer is GaAs.

21. The method of backside metal processes described in claim 1, wherein said etching process is the dry etching process using the reactive ion etching (RIE) or inductively coupled plasma (ICP) plasma technique, or the wet etching process using suitable chemical solutions as etchants.

22. The method of backside metal processes described in claim 1, wherein the materials of said oxidation preventing layer is Au, Pd, Ni—Au, N—Pd, Pd—Au, or Ni—Pd—Au.

* * * * *